(12) United States Patent
Murai et al.

(10) Patent No.: US 7,999,401 B2
(45) Date of Patent: Aug. 16, 2011

(54) SEMICONDUCTOR DEVICE AND METHOD OF MANUFACTURING SAME

(75) Inventors: Hideya Murai, Tokyo (JP); Kentaro Mori, Tokyo (JP); Shintaro Yamamichi, Tokyo (JP); Masaya Kawano, Kanagawa (JP); Takehiko Maeda, Kanagawa (JP); Kouji Soejima, Kanagawa (JP)

(73) Assignees: NEC Corporation, Tokyo (JP); Renesas Electronics Corporation, Kanagawa (JP)

(*) Notice: Subject to any disclaimer, the term of this patent is extended or adjusted under 35 U.S.C. 154(b) by 302 days.

(21) Appl. No.: 12/178,683

(22) Filed: Jul. 24, 2008

(65) Prior Publication Data

US 2009/0026636 A1 Jan. 29, 2009

(30) Foreign Application Priority Data

Jul. 24, 2007 (JP) ................................. 2007-192026

(51) Int. Cl.
*H01L 21/768* (2006.01)
*H01L 23/522* (2006.01)

(52) U.S. Cl. . 257/797; 257/690; 257/700; 257/E23.178; 257/E23.179; 29/841; 438/16; 361/761

(58) Field of Classification Search .................. 257/690, 257/700, 797, E23.178, E23.179; 29/841; 438/16; 361/761
See application file for complete search history.

(56) References Cited

U.S. PATENT DOCUMENTS

| | | | | |
|---|---|---|---|---|
| 5,532,091 A | * | 7/1996 | Mizutani | 430/22 |
| 6,303,459 B1 | * | 10/2001 | Chen | 438/401 |
| 7,781,901 B2 | * | 8/2010 | Tanemura | 257/797 |
| 2002/0102812 A1 | * | 8/2002 | Yeh et al. | 438/401 |
| 2004/0168825 A1 | * | 9/2004 | Sakamoto et al. | 174/260 |
| 2007/0210394 A1 | * | 9/2007 | Kanakasabapathy et al. | 257/421 |

FOREIGN PATENT DOCUMENTS

JP 2001-332863 11/2001

* cited by examiner

*Primary Examiner* — Eugene Lee
*Assistant Examiner* — Peniel M Gumedzoe
(74) *Attorney, Agent, or Firm* — Young & Thompson (57) ABSTRACT

Semiconductor device has a semiconductor chip embedded in an insulating layer. A semiconductor device comprises a semiconductor chip formed to have external connection pads and a positioning mark that is for via formation; an insulating layer containing a non-photosensitive resin as an ingredient and having a plurality of vias; and wiring electrically connected to the external connection pads through the vias and at least a portion of which is formed on the insulating layer. The insulating layer is formed to have a recess in a portion above the positioning mark. The bottom of the recess is the insulating layer alone. Vias have high positional accuracy relative to the mark.

20 Claims, 6 Drawing Sheets

SEMICONDUCTOR DEVICE AND METHOD OF MANUFACTURING SAME

BACKGROUND

1. Technical Field

This application is based upon and claims the benefit of the priority of Japanese patent application No. 2007-192026 filed on Jul. 24, 2007, the disclosure of which is incorporated herein in its entirety by reference thereto.

This invention relates to a semiconductor device in which a semiconductor chip is embedded in an insulating layer consisting of a resin or the like, and to a method of manufacturing this semiconductor device. More particularly, the invention relates to a high-yield semiconductor device exhibiting superior reliability, and to a method of manufacturing this device.

2. Description of the Related Art

Semiconductor devices that have become the focus of attention in recent years include a semiconductor device referred to as an "embedded-chip substrate", in which a semiconductor chip such as a diced LSI chip has been embedded in a resin substrate, or a semiconductor device having an insulating resin layer and a wiring layer formed directly on a semiconductor chip without the intermediary of a solder bump or like. In such semiconductor devices as the embedded-chip substrate, it is necessary to electrically connect external connection pads for the chip and external wiring by forming vias after the chip is embedded in the insulating material.

A photosensitive resin in which vias can be formed by exposure and development is capable of being used as the insulating material used in the embedded-chip substrate. However, since photosensitive resin generally has little mechanical strength, a semiconductor device that uses photosensitive resin as the insulating material often involves problems in terms of reliability. For this reason, non-photoconductive resin often is used as the insulating material of the semiconductor device. Non-photoconductive resin exhibits superior reliability owing to its large mechanical strength and, since it is used widely in printed circuit boards and the like, is additionally advantageous in that it can be produced in large quantity and at a low cost.

In a case where non-photoconductive resin is used as the insulating layer of a semiconductor device that internally incorporates a semiconductor chip, formation of vias by laser irradiation generally is used because the vias cannot be formed by exposure and development. In a semiconductor device internally incorporating a semiconductor chip, a chip that has been diced from a wafer is mounted on a supporting substrate or the like. Then, in order to form vias, laser vias are formed in the entirety of the substrate, on which the chip is mounted, using a common positioning mark. Consequently, it is difficult to form highly precise laser vias owing to error in chip-mounting accuracy. Accordingly, in order to assure a high accuracy in positions of vias by so arranging it that there is no chip mounting error, it is preferred that laser vias be formed using as a reference a positioning mark corresponding to each individual chip.

In relation to a technique for forming laser vias using a positioning mark as a reference, Patent Document 1 (see FIG. 8) discloses forming a positioning mark 131 on a core substrate 130 using a positioning mark 123 of an IC chip 120 as a reference and forming vias (via holes) 160 in conformity with the positioning mark 131. As a result, the vias 160 can be formed accurately on pads 124 of the IC chip 120 and the pads 124 and via holes 160 can be connected reliably.

[Patent Document 1] Japanese Patent Kokai Publication No. 2001-332863 (FIG. 6)

SUMMARY OF THE DISCLOSURE

The entire disclosures of above Patent Document are herein incorporated by reference thereto. The following analysis is given by the present invention.

However, the prior art described above involves a problem set forth below.

There are many cases where a filler such as an inorganic filler is added to the resin in which the chip is embedded. The reason for this is that since the coefficient of thermal expansion of the resin is nearly ten times that of Si, which is the material from which the semiconductor chip is made, there is the danger that this difference in the coefficients of thermal expansion will have a deleterious effect upon the reliability of the semiconductor device evaluated in a temperature cycle test or the like. Accordingly, in order to improve reliability by lowering the coefficient of thermal expansion of the embedding resin, a widely followed practice is to fill the insulating layer applied to the embedding resin with an inorganic film such as silica filler having a low coefficient of thermal expansion.

Figure 8:
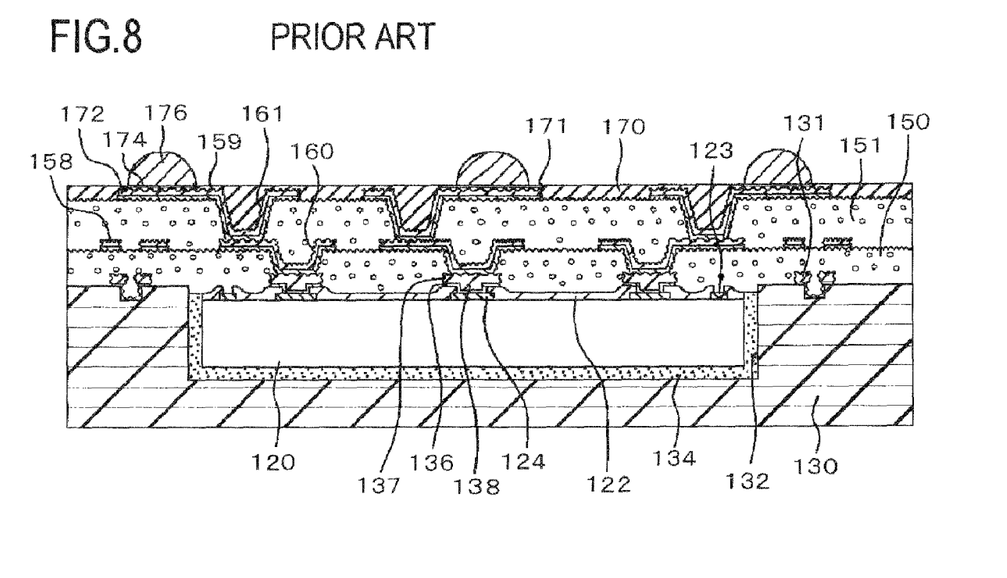
FIG. 8 is a sectional view schematically illustrating the structure of a semiconductor device according to the prior art.

However, the filler often is opaque. But even if it is transparent, the refractive index of the filler does not completely coincide with that of the resin and therefore the inclusion of the filler results in an insulating layer that is cloudy and opaque. In Patent Document 1, the positioning mark 131 is situated below an interlayer resin insulating layer 150. There is no problem if the interlayer resin insulating layer 150 is transparent. If the interlayer resin insulating layer 150 is opaque, however, the positioning mark 131 either cannot be recognized by a camera or cannot be recognized accurately. In particular, if the positioning mark 131 is small, recognition of the positioning mark 131 is difficult and, hence, so is highly precise positioning.

An example of a case where the positioning mark is small is one where the mark is used upon being formed on a semiconductor chip. In this case the positioning mark cannot be made large because of placement of the LSI circuit and external connection pads of the semiconductor chip. Recognition of the positioning mark is particularly difficult in such case. Further, if the semiconductor chip has a large number of pins, the external connection pads on the semiconductor chip are small. Consequently, a high via position accuracy is required. If the accuracy with which the positioning mark is recognized declines, the result can be faulty connections and poor yield for the semiconductor device.

Accordingly, it is an object of the present invention to provide a semiconductor device of high yield, excellent reliability, high via position accuracy and large number of external connection pins, as well as a method of manufacturing this semiconductor device.

According to a first aspect of the present invention, there is provided a semiconductor device comprising: a semiconductor chip having external connection pads and at least one positioning mark for via formation that are formed on the side of a semiconductor active layer; an insulating layer containing a non-photosensitive resin as an ingredient and having a plurality of vias formed at positions that conform to the external connection pads; and wiring electrically connected to the external connection pads through the vias and at least a portion of which is formed on the insulating layer. The insulating layer is formed to have a recess in a portion above the positioning mark.

According to a second aspect of the present invention, there is provided a method of manufacturing a semiconductor device. The method comprises: forming an insulating layer, which contains a non-photosensitive resin as an ingredient, on a semiconductor chip having external connection pads and a positioning mark for via formation that are formed on the side of a semiconductor active layer; forming a recess in the insulating layer. The insulating layer over the positioning mark by first laser irradiation. The method further comprises: forming vias in the insulating layer at positions that conform to the external connection pads by second laser irradiation using the positioning mark as a reference. The wiring is formed electrically connected to the external connection pads through the vias and at least a portion of which is formed on the insulating layer.

In accordance with the semiconductor device of the present invention, a recess is formed in an insulating layer over a positioning mark so that this portion of the insulating layer is made thinner than the other portions thereof. The result is a semiconductor device having a positioning mark that can be recognized with high precision and exhibiting a high via position accuracy and a superior reliability that is afforded by excellent connection to external connection pads on an LSI chip. Further, since the recess is formed only in the part of the insulating layer above the positioning mark, the semiconductor active layer is not exposed. Since the semiconductor elements are not readily damaged, the result is a semiconductor device of excellent reliability in this respect as well. Further, since via position accuracy can be improved, it is possible to provide a semiconductor device in which the external connection pads on the semiconductor chip are arranged at a narrow pitch.

In accordance with the method of manufacturing a semiconductor device according to the present invention, the insulating layer is removed by first laser irradiation up to the portion thereof above the positioning mark, whereby the portion of the insulating layer over the positioning mark is made thinner than other portions and recognition of the positioning mark is facilitated. The positional accuracy of vias formed in the insulating layer by second laser irradiation using the positioning mark as a reference is improved. As a result, it is possible to manufacture a semiconductor device of superior reliability afforded by excellent connection between wiring and external connection pads on the semiconductor chip. Further, since the semiconductor active layer of the semiconductor chip is not exposed. This makes it possible to manufacture a highly reliable semiconductor device the semiconductor element of which is not readily damaged.

Preferred Modes

In the semiconductor device according to the present invention, preferably the recess has a bottom that is solely the insulating layer.

In the semiconductor device according to the present invention, the recess has a bottom that may reach the positioning mark. In this case, it is preferred that the bottom of the recess does not reach the semiconductor active layer.

In the semiconductor device according to the present invention, it is preferred that wiring be formed in the recess as well.

In the semiconductor device according to the present invention, it is preferred that the insulating layer contain a filler.

In the semiconductor device according to the present invention, it is preferred that the insulating layer be translucent or opaque.

In the semiconductor device according to the present invention, it is preferred that the recess have a diameter larger than via diameter.

In the semiconductor device according to the present invention, preferably the recess has a bottom that encompasses the positioning mark.

At the step of forming the recess in the method of manufacturing the semiconductor device according to the present invention, it is preferred that the recess be formed in such a manner that the positioning mark is not exposed at the bottom of the recess.

At the step of forming the recess in the method of manufacturing the semiconductor device according to the present invention, the recess may be formed in such a manner that the positioning mark is exposed at the bottom of the recess. At the step of forming the recess in this case, it is preferred that the recess be formed in such a manner that the semiconductor active layer is not exposed at the bottom of the recess.

Other features and advantages of the present invention will be apparent from the following description taken in conjunction with the accompanying drawings, in which like reference characters designate the same or similar parts throughout the figures thereof.

PREFERRED EXEMPLARY EMBODIMENTS

Preferred exemplary embodiments of the present invention will now be described in detail with reference to the drawings.

First Exemplary Embodiment

Figure 1:
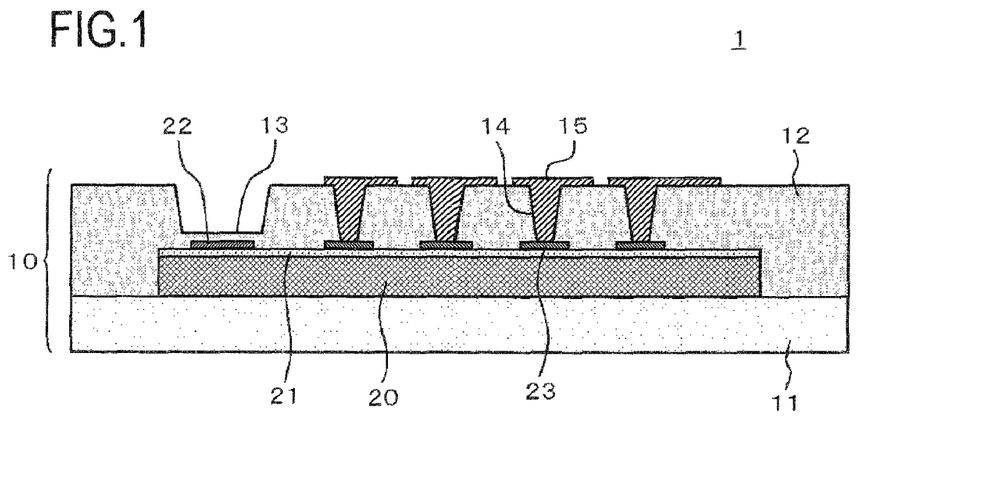
FIG. 1 is a sectional view schematically illustrating the structure of a semiconductor device according to a first exemplary embodiment of the present invention.
Figure 2:
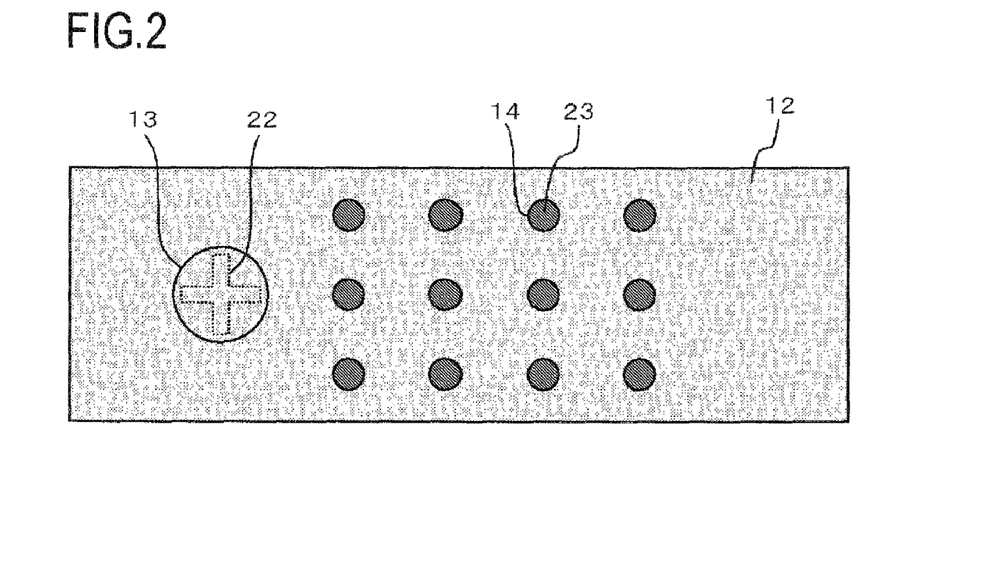
FIG. 2 is a top view of FIG. 1 schematically illustrating the structure of the semiconductor device according to the first exemplary embodiment.

Reference will be had to the drawings to describe a semiconductor device according to a first exemplary embodiment of the present invention. FIG. 1 is a sectional view schematically illustrating the structure of a semiconductor device 1 according to a first exemplary embodiment of the present invention, and FIG. 2 is a top view of FIG. 1 schematically illustrating the structure of the semiconductor device 1 according to the first exemplary embodiment. It should be noted that wiring 15 in FIG. 1 is not illustrated in FIG. 2 in order to simplify the description.

The semiconductor device 1 according to the first exemplary embodiment is an embedded-chip substrate in which a semiconductor chip 20 is embedded in a wiring substrate 10. The wiring substrate 10 has a supporting substrate 11, an insulating layer 12, a recess 13, vias 14 and wiring 15.

The supporting substrate 11 is a substrate that supports the semiconductor chip 20. Examples of substrates that can be used as the supporting substrate 11 are a metal plate such as a copper plate, aluminum plate or AlSiC plate; a substrate that includes a resin material, such as an FR-R substrate; and a resin-film material such as polyimide film.

The insulating layer 12 is formed so as to cover the semiconductor chip 20 on the supporting substrate 11. The insulating layer 12 is formed to have a plurality of vias 14, which communicate with external connection pads 23, at positions conforming to the external connection pads 23. The insulating layer 12 is further formed to include the recess 13, which does not communicate with a positioning mark 22, at a position corresponding to the positioning mark 22. The thickness of the insulating layer 12 on the semiconductor chip 20 (on the top side of the external connection pads 23 and positioning mark 22) may be, for instance, several microns to several hundred microns, preferably several tens of microns. The positions conforming to the external connection pads 23 are positions where the positions of the external connection pads 23 and positions of the vias 14 coincide, and it is particularly important that the bottoms of the vias not deviate from the external connection pads 23. The reason for this is that if the bottom of a via should happen to deviate from the external connection pad 23, damage from a laser or the like at the time of via formation will reach a semiconductor active layer 21, which is layer underlying the external connection pad 23, directly, and this will destroy the wiring and semiconductor elements in the semiconductor active layer 21.

An ingredient of the insulating layer 12 is a non-photosensitive resin. The insulating layer 12 is translucent or opaque. It will suffice if the insulating layer 12 contains a non-photosensitive resin, and it may also contain various fillers such as an inorganic filler or organic filler. The non-photosensitive resin is a resin that cannot be patterned by ordinary exposure and development, etc., and various resins such as epoxy resin, acrylate resin and polyimide resin can be used. Silica filler is an example of a filler that can be used as the inorganic filler.

The recess 13 is a hole formed in the insulating layer 12 and is formed at the position of the positioning mark 22 in such a manner that it will not communicate with the positioning mark 22. The recess 13 is for forming vias 14, etc., using the positioning mark 22 on the semiconductor chip 20 in order to eliminate error in chip mounting precision in a case where the semiconductor chip 20 is a diced semiconductor chip. The recess 13 is formed in the insulating layer 12 above the positioning mark 22. It should be noted that in a case where the insulating layer 12 has little transparency and the positioning mark 22 cannot be recognized, the recess can be formed by estimating the position of the positioning mark 22 from the external shape of the supporting substrate 11 or insulating layer 12.

It is required that the recess 13 have enough depth to improve the recognizability of the positioning mark 22. For example, depending upon the transparency of the insulating layer 12, a suitable depth of the recess 13 can be set to 10% to 90% of the thickness (for instance, several microns to several hundred microns) of the insulating layer 12 on the semiconductor chip 20.

It is required that the diameter of the recess 13 be large enough to allow recognition of the positioning mark 22. Preferably, the diameter of the recess 13 should be made equal to or greater than the diameter of the vias 14. The reason for this is as follows: In general, the diameter of the positioning mark 22 is larger than the diameter of the vias 14, as illustrated in FIG. 1. Further, since the vias 14 are formed using as a reference the positioning mark 22 whose recognition has been facilitated, the vias 14 can be positioned with a high degree of accuracy, whereas it is necessary to form the recess 13 on the positioning mark 22 that cannot yet be recognized clearly or at all.

The bottom of the recess 13 is solely the insulating layer 12; the positioning mark 22 is not exposed. The bottom of the recess 13 is placed so as to encompass the positioning mark 22 as seen from above.

The vias 14 are basic holes formed in the insulating layer 12 by a laser or the like. The vias 14 are formed at positions conforming to the external connection pad 23 in such a manner that they do not communicate with the external connection pads 23.

The wiring 15 is electrically connected to the external connection pads 23 through the vias 14 and at least a portion of the wiring 15 is formed on the insulating layer 12. Although copper or copper wiring, for example, can be used as the wiring 15, it is also possible to use aluminum or other metal wiring or wiring that has been formed from a metal paste material containing a resin material as a binder.

The semiconductor chip 20 has been diced primarily from a wafer. Besides chips of silicon semiconductor, other examples are chips of compound semiconductor. A plurality of the external connection pads 23 and at least one positioning mark 22 for forming the vias 14 have been formed on the semiconductor chip 20 on the same side as that of the semiconductor active layer 21. Further, the semiconductor chip 20 can be readily embedded in the insulating layer 12. Since it is preferred that the semiconductor device 1 itself be thin, preferably the semiconductor chip 20 is made thin beforehand as by a grinding operation. A semiconductor chip having a thickness of 10 to 100 μm can be used as the semiconductor chip 20 thus thinned. Furthermore, the semiconductor active layer 21 is a layer in which semiconductor elements and wiring are fabricated.

The positioning mark 22 is a mark serving as a reference for deciding the position of the vias 14 formed by a laser or the like. It will suffice if the shape of the positioning mark 22 is one that enables position to be specified. Although various shapes are possible, such as the shape of a cross or circle, it is preferred that the shape be such that positioning can be performed with as high an accuracy as possible based upon size, shape and use of a CCD camera, etc. It is required that at least one positioning mark 22 be provided on the semiconductor chip 20. Although positioning is possible with just one positioning mark 22, it is preferred that two, three or more be provided in order to perform positioning even more accurately. Although the positioning mark 22 may be formed in the same layer as that of the external connection pads 23, it may just as well be formed in a different layer. If the positioning mark 22 is formed in the same layer as that of the external connection pads 23, then a metal such as copper or aluminum or an alloy thereof can be used. The height of the positioning mark 22 can be made on the order of, e.g., 0.1 μm to several microns.

The external connection pads 23 are pads for electrically connecting semiconductor elements, which have been fabricated near the chip surface, with the outside. The pads are connected to any of the power source, ground or signal lines of the semiconductor elements. The external connection pads 23 are formed of an electrically conductive material composed of a material an ingredient of which is Al or Cu. It is possible to use Al alone, Cu alone or alloys such as Al—Si, Al—Cu and Al—Si—Cu.

In the semiconductor device 1 of FIG. 1, the semiconductor chip 20 and insulating layer 12, etc., have been mounted and formed, respectively, on the supporting substrate 11. However, the supporting substrate 11 is not an essential requisite of the semiconductor device of the present invention and may or may not be provided. Examples of cases where the supporting substrate is not provided are a case where the semiconductor chip is mounted in embedded fashion in an insulating layer such as a B stage, and a case where the semiconductor chip is mounted on the supporting substrate, the insulating layer is formed on the supporting substrate and the supporting substrate is removed after the insulating layer cures.

Figure 3:
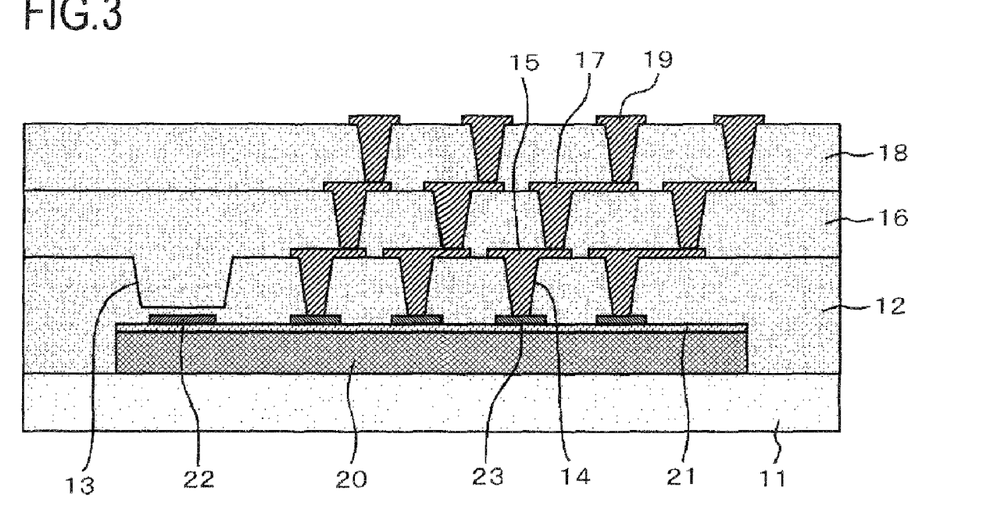
FIG. 3 is a sectional view schematically illustrating the structure of a modification of the semiconductor device according to the first exemplary embodiment.

Further, the semiconductor device 1 of FIG. 1 has a single-layer wiring structure in which the insulating layer 12 and wiring 15 are formed of single layers. However, the semiconductor device can have a multilayer wiring structure in which multiple insulating layers 16, 18 and multiple wiring layers 17, 19 are formed on the above-mentioned layers, as illustrated in FIG. 3. Further, an insulating layer (not shown) of solder resist or the like may be formed on the uppermost layer so as to cover at least part of the wiring 19.

Further, in the semiconductor device 1 of FIG. 1, the wiring 15 is not formed on the recess 13 in the insulating layer 12 over the positioning mark 22. However, the wiring 15 may be formed on the recess 13 in the insulating layer 12 over the positioning mark 22 as well. By forming the wiring 15 in the recess 13 in the insulating layer 12 over the positioning mark 22 as well, the wiring 15 can be formed by exploiting the insulating layer 12 effectively. Since the insulating layer 12 will be present on the bottom of the recess 13 in such case, short-circuiting between the wiring 15 and wiring present in the semiconductor active layer 21 will not occur.

Next, reference will be had to the drawings to describe a method of manufacturing the semiconductor device according to the first exemplary embodiment of the present invention. FIGS. 4A to 4E are process sectional views schematically illustrating a method of manufacturing the semiconductor device according to the first exemplary embodiment of the present invention.

Figure 4A:
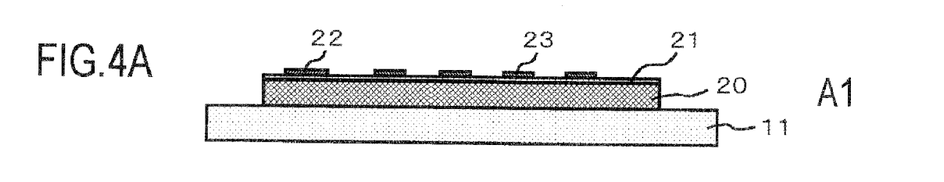
FIGS. 4A to 4E are process sectional views schematically illustrating a method of manufacturing a semiconductor device according to a first exemplary embodiment of the present invention.
Figure 4B:
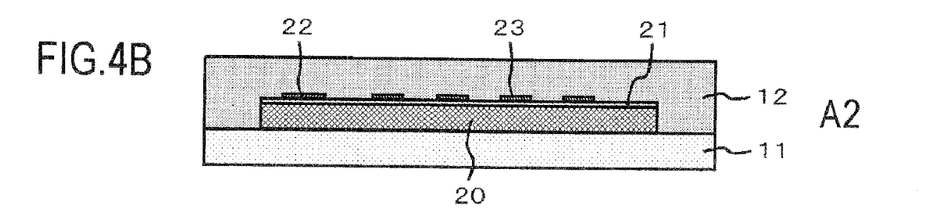

According to the method of manufacturing the semiconductor device according to the first exemplary embodiment, first a semiconductor chip 20 is mounted on a supporting substrate 11 (step A1; FIG. 4A). Here the semiconductor chip 20 is mounted by facing the underside of the semiconductor chip 20 (the side opposite that on which the external connection pads 23 are provided) toward the side of the supporting substrate 11. The mounting of the semiconductor chip 20 can be achieved by affixing it to the supporting substrate 11 using, e.g., silver paste, a die-attaching film or some other bonding agent (not shown)

Next, an insulating layer 12 is formed on the supporting substrate 11 that includes a semiconductor chip 20 (step A2; FIG. 4E). Although a semiconductor active layer 21 of the semiconductor chip 20 is faced upward and the insulating layer 12 is formed on the semiconductor active layer 21 in FIG. 4B, this invention is not limited to this arrangement. It is permissible to adopt a method of mounting the chip on the insulating layer 12, which has been prepared in advance, with the semiconductor active layer 21 of the semiconductor chip 20 faced downward.

Figure 4C:
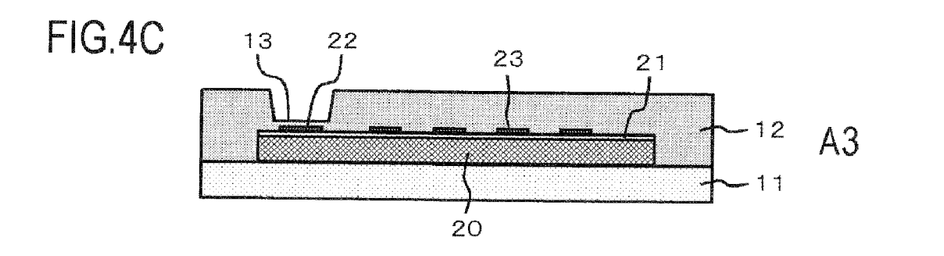

Next, a portion of the insulating layer 12 over the positioning mark 22 is removed by first laser irradiation in such a manner that the positioning mark 22 is not exposed, thereby forming a recess 13 in the insulating layer 12 (step A3; FIG. 4C). Here an Nd-YAG laser, a $CO_2$ laser or an excimer laser can be used, by way of example.

Figure 4D:
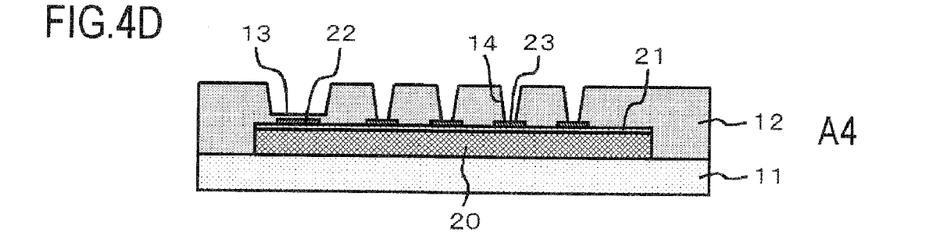

Next, by using the positioning mark 22 as a reference, the vias 14 are formed in the insulating layer 12 by second laser irradiation at positions conforming to the external connection pads 23 in the insulating layer 12 (step A4; FIG. 4D).

Here an Nd-YAG laser, a $CO_2$ laser or an excimer laser can be used as the second laser, by way of example. It should be noted that since the vias 14 often are small in comparison with vias used in a printed circuit board, use of a (third-order higher harmonic, etc.) Nd-YAG laser or excimer laser, which is capable of forming vias of a size smaller than several tens of microns, is especially preferred. Further, the recess 13 and vias 14 can be formed by different lasers. For example, a $CO_2$ laser can be used to form the recess 13 and a Nd-YAG laser can be used to form the vias 14. Since the laser irradiation area of the positioning mark 22 is large in size, registration is possible with the an Nd-YAG laser as well but it is better to use a $CO_2$ laser.

Further, after second laser irradiation, it is preferred that particles (debris) of the insulating layer 12 left at the bottom of the vias 14 be removed by a mild method such as dry etching or wet etching, which has little effect upon the wiring and lower layer of the semiconductor chip 20. Examples of dry etching are icing using a gas such as $O_2$, $N_2$, Ar or $CF_4$, IBE (ion-beam etching) or RIE (reactive ion etching). Further, a liquid chemical that removes by oxidation a resin used in de-smearing, etc., can be used in wet etching.

Figure 4E:
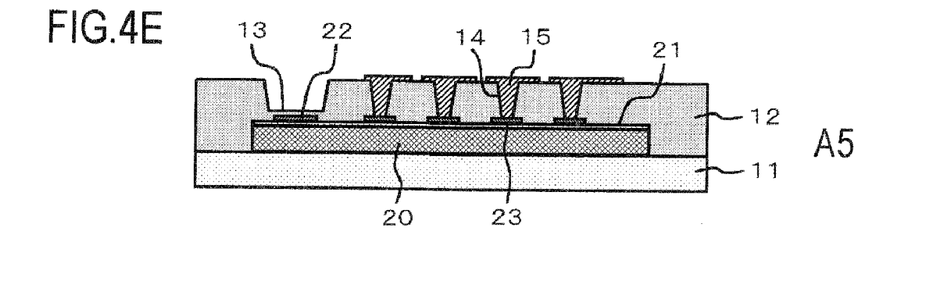

This is followed by forming the wiring 15, which connects to the external connection pads 23 through the vias 14, on the insulating layer 12 (step A5; FIG. 4E).

Although it is possible for the wiring 15 to be formed by a dry process such as sputtering or CVD, it is preferred that the wiring be formed by a plating process such as electroplating or non-electrolytic plating. In this case, the wiring 15 can be formed in the vias 14 by a single plating step, in which case at least some of the wiring 15 is formed on the insulating layer 12. Further, in a case where the plating step is carried out, the insulating layer 12 still remains beneath the bottom surface of the recess 13 and the semiconductor active layer 21 is not exposed. This means that the plating step involves almost no damage relating to the semiconductor active layer 21. In particular, the semiconductor active layer 21 is not contaminated by a developing solution and etching solution, etc., when plating resist is developed, when the resist is peeled off, and at the time of etching of a seed layer following a plating step according to the semi-additive process. In other words, even if an inexpensive, readily contaminated developing solution (an alkaline developing solution containing an alkaline metal such as sodium or potassium or an alkaline earth metal such as calcium) employed in a printed circuit board process or a stripping solution is used in the plating process, the semiconductor active layer 21 is not contaminated because it is not exposed at the recess 13.

In accordance with the semiconductor device according to the first exemplary embodiment, the recess 13 is formed in the insulating layer 12 at the position above the positioning mark 22, thereby making this portion of the insulating layer 12 thinner than the other portions. The result is a semiconductor device having a positioning mark that can be recognized with high precision, and exhibiting a high via position accuracy and a superior reliability that is afforded by excellent connection to external connection pads 23 on the semiconductor chip 20. In other words, the positional accuracy of the vias 14 can be improved and a semiconductor device of superior reliability can be provided at a high yield. Further, since the positional accuracy of the vias 14 is can be improved, it is possible to provide a semiconductor device in which the external connection pads 23 on the semiconductor chip 20 are provided at a narrow pitch.

Further, in accordance with the semiconductor device according to the first exemplary embodiment, since the recess 13 is formed only in the part of the insulating layer 12 above the positioning mark 22, the semiconductor active layer 21 of the semiconductor chip 20 is not exposed. Since the semiconductor elements in the semiconductor active layer 21 are not readily damaged, the result is a semiconductor device of excellent reliability in this respect as well.

Examples of damage to semiconductor elements are damage caused by the laser when the recess 13 is formed in the insulating layer 12, and damage that follows the formation of the recess 13. Damage caused by the laser when the recess 13 is formed in the insulating layer 12 refers to damage sustained by wiring and semiconductor elements in the semiconductor active layer 21 underlying the recess 13 owing to irradiation with the laser when the recess 13 is formed In the first exemplary embodiment, there is almost no damage due to the laser because the insulating layer 12 still remains below the recess 13 when the recess 13 is formed. On the other hand, damage that follows the formation of the recess 13 refers to damage to the semiconductor elements ascribable to development and etching steps performed when the wiring 15 is formed.

It should be noted that in comparison with the wiring formed on or inside a printed circuit board, the wiring in the layer underlying the semiconductor chip 20 has a width and thickness that are smaller by an order of magnitude of one, two or more. Consequently, damage caused by a laser at the formation of the recess 13 is a major problem, though it is not a problem in the case of a circuit board. In the first exemplary embodiment, on the other hand, there is almost no damage relating to the semiconductor active layer 21 because the lower part of the insulating layer 12 still remains even after the recess 13 is formed. The reason for this is that the reliability of the semiconductor device is assured not only in a case where the final form of the semiconductor is such that the active surface thereof is not exposed but also in a case where the recess 13 in the insulating layer 12 above the positioning mark is finally filled with another insulating layer. Specifically, even if a foreign substance such as water should happen to penetrate from the interface between the insulating layers, the insulating layer 12 remaining over the positioning mark 22 acts as a layer that protects the semiconductor active layer 21, thereby preventing the foreign substance from reaching the interface with the semiconductor chip 20.

In accordance with the method of manufacturing the semiconductor device according to the first exemplary embodiment, the insulating layer 12 is removed by first laser irradiation up to the portion thereof above the positioning mark 22. As a result, the portion of the insulating layer 12 above the positioning mark 22 becomes thinner than the other portions thereof, the positioning mark 22 becomes easier to recognize, the positional accuracy of the vias 14 is improved by second laser irradiation using the positioning mark 22 as a reference and it is possible to manufacture a semiconductor device of superior reliability afforded by excellent connection to the external connection pads 23. Further, it is possible to manufacture a highly reliable semiconductor device in which the semiconductor elements are not readily damaged because the semiconductor active layer 21 of the semiconductor chip 20 is not exposed.

Second Exemplary Embodiment

Figure 5:
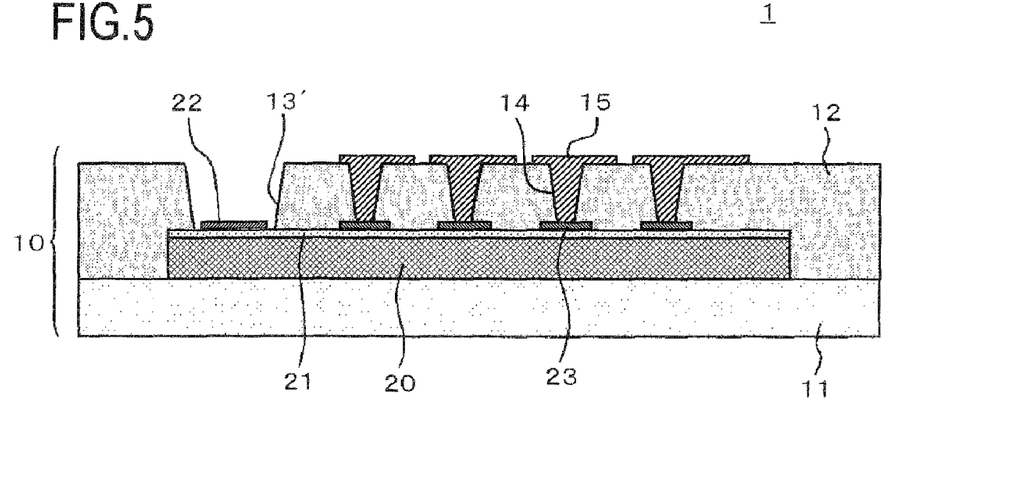
FIG. 5 is a sectional view schematically illustrating the structure of a semiconductor device according to a second exemplary embodiment of the present invention.
Figure 6:
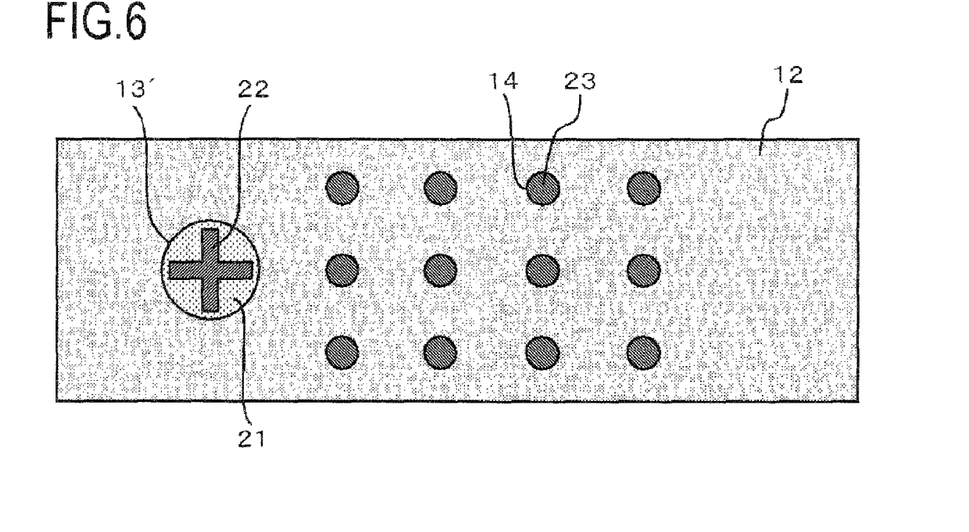
FIG. 6 is a top view of FIG. 5 schematically illustrating the structure of the semiconductor device according to the second exemplary embodiment.

Reference will be had to the drawings to describe a semiconductor device according to a second exemplary embodiment of the present invention. FIG. 5 is a sectional view schematically illustrating the structure of a semiconductor device 1 according to a second exemplary embodiment of the present invention, and FIG. 6 is a top plan view of FIG. 5 schematically illustrating the structure of the semiconductor device 1 according to the second exemplary embodiment. It should be noted that wiring 15 in FIG. 5 is not illustrated in FIG. 6 in order to simplify the description.

In the semiconductor device 1 according to the second exemplary embodiment, the bottom of a recess 13' in the insulating layer 12 above the positioning mark 22 reaches down to the positioning mark 22. Other structural elements are similar to those of the first exemplary embodiment.

Next, reference will be had to the drawings to describe a method of manufacturing the semiconductor device according to the second exemplary embodiment of the present invention. FIGS. 7A to 7E are process sectional views schematically illustrating a method of manufacturing the semiconductor device according to the second exemplary embodiment of the present invention.

Figure 7A:
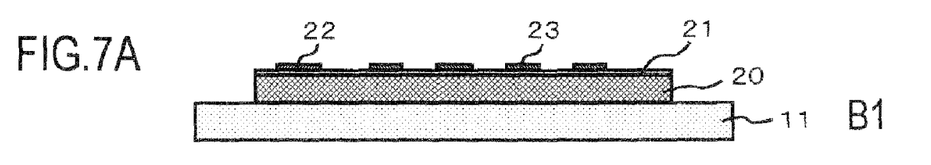
FIGS. 7A to 7E are process sectional views schematically illustrating a method of manufacturing a semiconductor device according to a second exemplary embodiment of the present invention.

According to the method of manufacturing the semiconductor device of the second exemplary embodiment, first the semiconductor chip 20 is mounted on the supporting substrate 11 (step B1; FIG. 7A) in a manner similar to that of step A1 of the first exemplary embodiment.

Figure 7B:
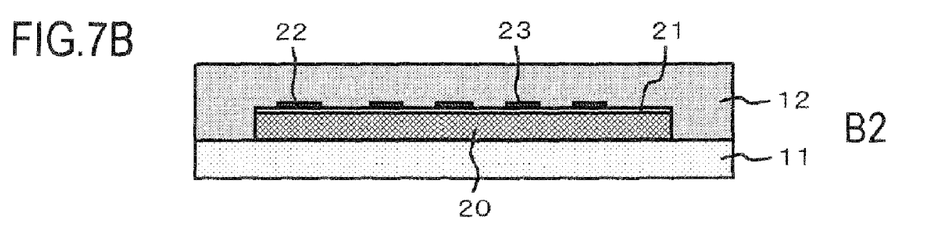

Next, in a manner similar to that of step A2 of the first exemplary embodiment, the insulating layer 12 is formed on the supporting substrate 11 that includes the semiconductor chip 20 (step B2; FIG. 7B).

Figure 7C:
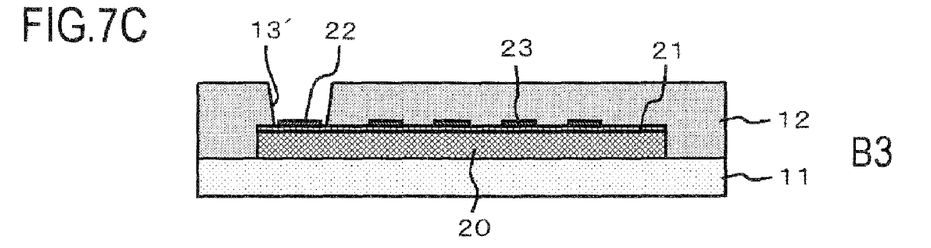

Next, the insulating layer 12 over the positioning mark 22 is removed by a first laser irradiation until the positioning mark 22 is exposed, thereby forming the recess 13' in the insulating layer 12 (step B3; FIG. 7C). In other words, it is arranged so that the positioning mark 22 comes into view by removing the opaque insulating layer 12 over the positioning mark 22 of the semiconductor chip 20. As a result, the positioning mark 22 is rendered recognizable without damaging the underlying semiconductor chip 20. It is preferred to so arrange it that even though the positioning mark 22 is exposed in the recess 13', the semiconductor active layer 21 is not exposed. The reason is that there will be almost no damage relating to the semiconductor active layer 21 in the step (plating step) for forming the wiring 15 at step B5.

Figure 7D:
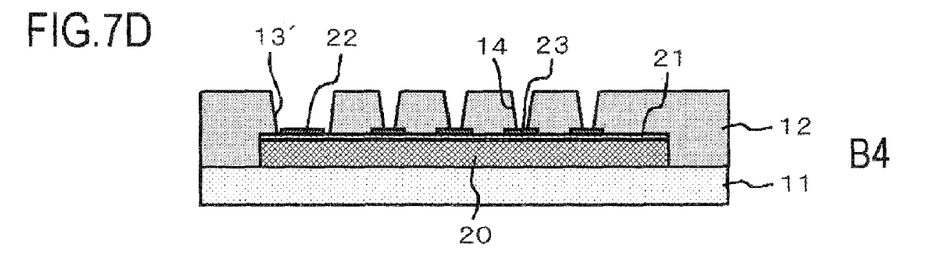

Next, by using the positioning mark 22 as a reference, the vias 14 are formed in the insulating layer 12 by the second laser irradiation at positions conforming to the external connection pads 23 in the insulating layer 12 (step B4; FIG. 7D). It should be noted that after the second laser irradiation is performed, particles of the insulating layer 12 remaining at the bottom of the vias 14 preferably are removed by a mild method such as dry etching or wet etching, which has little effect upon the wiring and lower layer of the semiconductor chip 20.

Figure 7E:
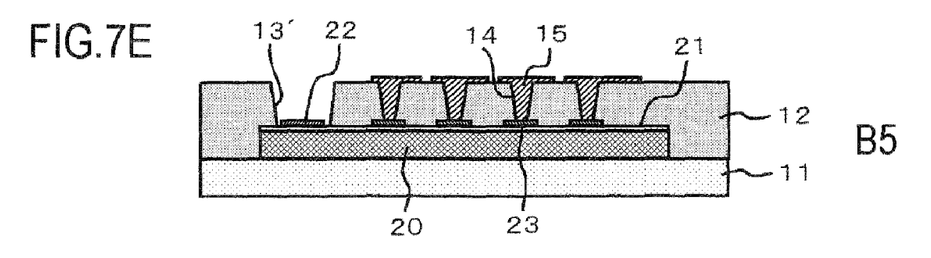

In a manner similar to that of step A5 of the first exemplary embodiment, this is followed by forming the wiring 15, which connects to the external connection pads 23 through the vias 14, on the insulating layer 12 (step B5; FIG. 7E).

In accordance with the semiconductor device 1 according to the second exemplary embodiment, the insulating layer 12 over the positioning mark 22 is removed and the positioning mark 22 is exposed from the recess 13'. The result is a semiconductor device in which the positioning mark 22 can be recognized more clearly, the positional accuracy of the vias 14 is improved and reliability is superior owing to excellent connection between the wiring 15 and the external connection pads 23 on the semiconductor chip 20. In other words, the positional accuracy of the vias 14 can be improved and a semiconductor device of superior reliability can be provided at a high yield. Further, since the positional accuracy of the vias 14 can be improved, it is possible to provide a semiconductor device in which the external connection pads 23 on the semiconductor chip 20 are provided at a narrow pitch.

Further, in accordance with the method of manufacturing the semiconductor device according to the second exemplary embodiment, the insulating layer 12 above the positioning mark 22 is removed by first laser irradiation until the positioning mark 22 is exposed. The result is a semiconductor device in which the positioning mark 22 can be recognized more clearly, the positional accuracy of the vias 14 owing to second laser irradiation is improved and reliability is superior owing to excellent connection between the wiring 15 and the external connection pads 23 on the semiconductor chip 20.

In the semiconductor device 1 of FIG. 5, the semiconductor chip 20 and insulating layer 12, etc., have been mounted and formed, respectively, on the supporting substrate 11. However, the supporting substrate 11 is not an essential requisite of the semiconductor device of the present invention and may or may not be provided. Further, the semiconductor device 1 of FIG. 5 has a single-layer wiring structure in which the insulating layer 12 and wiring 15 are formed of single layers. However, the semiconductor device can have a multilayer wiring structure in which multiple insulating layers and multiple wiring layers are formed on the above-mentioned layers. Further, an insulating layer (not shown) of solder resist or the like may be formed on the uppermost layer so as to cover at least part of the wiring.

Semiconductor devices in which the chip is incorporated within the substrate can be used in mobile telephones, personal computers, servers and various electrical devices as examples of utilization of the present invention.

As many apparently widely different exemplary embodiments of the present invention can be made without departing from the spirit and scope thereof, it is to be understood that the invention is not limited to the specific exemplary embodiments thereof except as defined in the appended claims.

What is claimed is:

1. A semiconductor device comprising:
a semiconductor chip having external connection pads and at least one positioning mark for via formation that are formed on the side of a semiconductor active layer;
an insulating layer containing a non-photosensitive resin as an ingredient and having a plurality of vias formed at positions that conform to the external connection pads; and
wiring electrically connected to the external connection pads through the vias and at least a portion of which is formed on said insulating layer;
wherein said insulating layer is formed to have a recess distinct from the vias and located in a portion above the positioning mark, said recess having a depth set based on a transparency of the insulating layer, the depth set to allow recognizing the positioning mark during manufacture.

2. The device according to claim 1, wherein the recess has a bottom that is solely said insulating layer.

3. The device according to claim 1, wherein the recess has a bottom that reaches the positioning mark.

4. The device according to claim 3, wherein the recess does not reach the semiconductor active layer.

5. The device according to claim 1, wherein said wiring is formed in the recess as well.

6. The device according to claim 1, wherein said insulating layer contains a filler.

7. The device according to claim 1, wherein said insulating layer is translucent or opaque.

8. The device according to claim 1, wherein the recess has a diameter larger than via diameter.

9. The device according to claim 1, wherein the recess has a bottom that encompasses the positioning mark.

10. A semiconductor device comprising:
a wiring substrate, the wiring substrate having a supporting substrate, a non-photosensitive resin insulating layer, a recess, vias, and wiring; and
a semiconductor chip located on the supporting substrate and embedded in the wiring substrate, the semiconductor chip having external connection pads and a positioning marker,
the insulating layer covering the semiconductor chip,
the insulating layer being translucent or opaque,
the vias formed in the insulating layer vertical over the semiconductor chip and the external connection pads, the vias in communication with the external connection pads, at positions conforming to the external connection pads,
the recess being within the insulating layer at a location apart from the vias, the recess having a lowermost surface with a width greater than a width of an uppermost surface of the positioning marker, the lowermost surface of the recess being located completely in registration with and encompassing the uppermost surface of the positioning marker.

11. The device according to claim 10, wherein the lowermost surface of the recess is located completely in vertical registration above the uppermost surface of the positioning marker.

12. The device according to claim 11, wherein,
only said insulating layer separates the lowermost surface of the recess from the uppermost surface of the positioning marker, and
a diameter of the positioning mark is larger than a diameter of the vias.

13. The device according to claim 1, wherein a lowermost surface of the recess is located in vertical registration above an uppermost surface of the positioning marker completely encompassing the positioning marker.

14. The device according to claim 1, wherein,
only said insulating layer separates the lowermost surface of the recess from the uppermost surface of the positioning marker, and
a diameter of the positioning mark is larger than a diameter of the vias.

15. The device according to claim 1, wherein said recess depth is 90% of the thickness of the insulating layer contacting said positioning mark.

16. The device according to claim 10, wherein said recess depth is 90% of the thickness of the insulating layer contacting said positioning mark.

17. The device according to claim 1, wherein said insulating layer is free of wiring in vertically aligned over recess said positioning mark.

18. The device according to claim 10, wherein said insulating layer is free of wiring vertically aligned over recess said positioning mark.

19. The device according to claim 1, wherein said recess depth is 100% of the thickness of the insulating layer contacting said positioning mark.

20. The device according to claim 10, wherein said recess depth is 100% of the thickness of the insulating layer contacting said positioning mark.

* * * * *